United States Patent

Bae et al.

(10) Patent No.: US 9,214,646 B2
(45) Date of Patent: Dec. 15, 2015

(54) DISPLAY APPARATUS INCLUDING DISTANCE SEPARATOR

(71) Applicant: Samsung Display Co., Ltd., Yongin, Gyeonggi-do (KR)

(72) Inventors: Kyu-Han Bae, Yongin (KR); Dai-Han Cho, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/265,687

(22) Filed: Apr. 30, 2014

(65) Prior Publication Data

US 2015/0171364 A1   Jun. 18, 2015

(30) Foreign Application Priority Data

Dec. 18, 2013  (KR) .................. 10-2013-0158676

(51) Int. Cl.
  *H01L 51/52*  (2006.01)
  *H01L 51/05*  (2006.01)
  *H01L 27/32*  (2006.01)

(52) U.S. Cl.
  CPC ........ *H01L 51/5246* (2013.01); *H01L 27/3244* (2013.01); *H01L 51/525* (2013.01)

(58) Field of Classification Search
  USPC .................................................. 257/40, 72
  See application file for complete search history.

(56) References Cited

U.S. PATENT DOCUMENTS

| 2004/0212300 | A1* | 10/2004 | Chao et al. ............... 313/506 |
| 2007/0152222 | A1* | 7/2007 | Joo ............................. 257/72 |
| 2011/0193478 | A1 | 8/2011 | Kim |
| 2013/0099700 | A1 | 4/2013 | Kreye et al. |
| 2014/0017967 | A1* | 1/2014 | Kim et al. .................... 445/25 |

FOREIGN PATENT DOCUMENTS

| KR | 10-2001-0011556 | 2/2001 |
| KR | 10-2003-0053164 | 6/2003 |
| KR | 10-2006-0036795 | 5/2006 |
| KR | 10-2009-0117242 | 11/2009 |
| KR | 10-2010-0035312 | 4/2010 |
| KR | 10-2011-0068171 | 6/2011 |
| KR | 10-2011-0092063 | 8/2011 |

* cited by examiner

*Primary Examiner* — Mamadou Diallo
(74) *Attorney, Agent, or Firm* — Knobbe Martens Olson & Bear LLP

(57) ABSTRACT

A display apparatus includes: a display panel including a substrate where a display unit is formed, and an encapsulation unit covering the display unit; a functional film adhered to the display panel; a window cover provided on the functional film; and an adhesive interposed in at least one of regions where the display panel, the functional film, and the window cover are adhered to each other, wherein a distance separator, including at least one opening for providing a path for ultraviolet rays for hardening the adhesive, is provided between the display panel and the window cover.

20 Claims, 4 Drawing Sheets

DISPLAY APPARATUS INCLUDING DISTANCE SEPARATOR

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims the benefit of Korean Patent Application No. 10-2013-0158676, filed on Dec. 18, 2013, in the Korean Intellectual Property Office, the disclosure of which is incorporated herein in its entirety by reference.

BACKGROUND

1. Field

One or more embodiments of the present invention relate to a display apparatus including a separator that maintains distance to prevent a substrate from being damaged.

2. Description of the Related Technology

Generally, an organic light-emitting display apparatus including a thin-film transistor (TFT) may be used as a display apparatus of a mobile device, such as a smart phone, a digital camera, a camcorder, a mobile information terminal, a super-slim laptop, or a tablet, or of an electronic or electric product, such as an ultra-thin television (TV).

The organic light-emitting display apparatus typically includes a first electrode, a second electrode, and an organic light-emitting device (OLED) including an intermediate layer disposed between the first and second electrodes. The organic light-emitting display apparatus has a wide view angle, excellent contrast, and a quick response speed.

Generally, in the display apparatus such as the organic light-emitting display apparatus, a window cover is provided on a display panel, and a gap exists between the display panel and the window cover. Due to the gap, the display apparatus may be easily damaged when dropped.

Various functional films may be adhered between the display panel and the window cover, and at this time, the various functional films need to be strongly adhered therebetween.

SUMMARY OF CERTAIN INVENTIVE ASPECTS

One or more embodiments of the present invention include a display apparatus including a separator that maintains distance so as to maintain structural strength.

Additional aspects will be set forth in part in the description which follows and, in part, will be apparent from the description, or may be learned by practice of the presented embodiments.

According to one or more embodiments of the present invention, a display apparatus includes: a display panel including a substrate where a display unit is formed, and an encapsulation unit covering the display unit; a functional film adhered on the display panel; a window cover provided on the functional film; and an adhesive interposed in at least one of regions where the display panel, the functional film, and the window cover are adhered to each other, wherein a distance separator, including at least one opening for providing a path for ultraviolet rays for hardening the adhesive, is provided between the display panel and the window cover.

The substrate may include an exposed region that extends towards an edge of the encapsulation unit, and the distance separator may be provided between the exposed region of the substrate and the window cover.

A plurality of pad units electrically connected to a wiring may be arranged in the exposed region of the substrate, and the distance separator may include a plurality of spacers provided on and insulated from the wiring or at least one of the regions where the plurality of pad units are formed.

The plurality of spacers may be spaced apart from each other in a direction crossing a direction where the wiring and the plurality of pad units are electrically connected to each other.

The plurality of spacers may be spaced apart from each other in a direction parallel to a direction in which the plurality of pad units are arranged.

The distance separator may include a plurality of spacers spaced apart from each other along one direction of the exposed region of the substrate, and the at least one opening may be formed between the plurality of spacers.

The plurality of spacers may include a plurality of first spacers arranged at two edges of the exposed region of the substrate, and at least one second spacer disposed between the plurality of first spacers.

The distance separator may include a plurality of spacers disposed along the exposed region of the substrate, and the at least one opening may form a single space between the plurality of spacers.

The plurality of spacers may include a first spacer and a second spacer respectively disposed at two edges of the exposed region, and the at least one opening may be formed in a single space between the first and second spacers.

The distance separator may have a size corresponding to a gap between the exposed region of the substrate and the window cover.

The distance separator may be provided between the window cover and a region where only one of the substrate and the encapsulation unit exists as one of the substrate and the encapsulation unit extends further than the other.

The exposed region of the substrate may be formed by enlarging any one region of the substrate such that a size of the substrate is larger than a size of the encapsulation unit.

The distance separator may include an insulating material.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF CERTAIN INVENTIVE EMBODIMENTS

Figure 1:
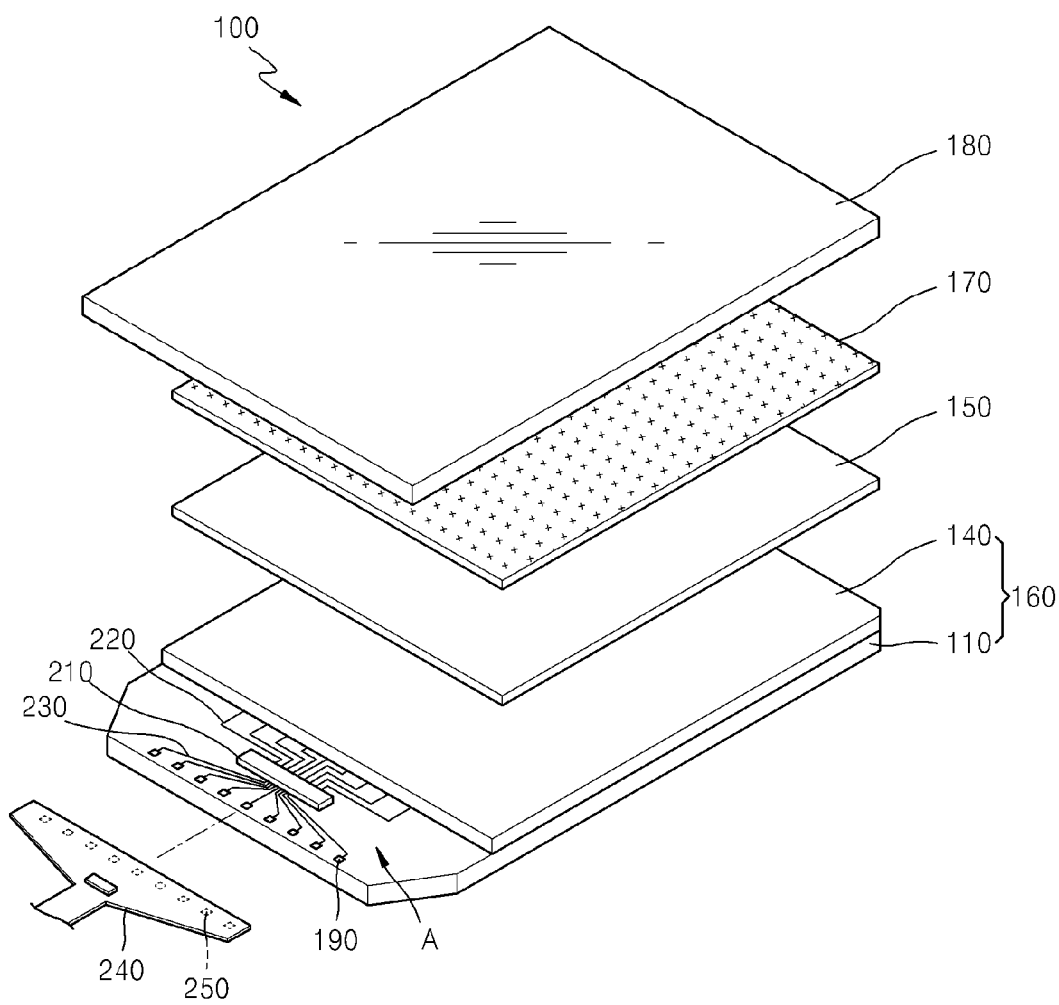
FIG. 1 is a perspective view of a display apparatus according to an embodiment of the present invention.

As the invention allows for various changes and numerous embodiments, certain embodiments are illustrated in the drawings and described in detail in the written description. However, this is not intended to limit the present invention to particular modes of practice, and it will to be appreciated that all changes, equivalents, and substitutes that do not depart from the spirit and technical scope of the present invention are encompassed in the present disclosure. In the description, certain detailed explanations of related art are omitted when it is deemed that they may unnecessarily obscure the essence of the invention.

While such terms as "first," "second," and the like may be used to describe various components, such components must not be limited to the above terms. The above terms are used only to distinguish one component from another.

The terms used in the present disclosure are merely used to describe certain embodiments, and are not intended to limit the present invention. An expression used in the singular encompasses the expression of the plural, unless it has a clearly different meaning in the context. In the present disclosure, it is to be understood that the terms such as "including" or "having," and the like, are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

As used herein, the term "and/or" includes any and all combinations of one or more of the associated listed items. Expressions such as "at least one of," when preceding a list of elements, modify the entire list of elements and do not modify the individual elements of the list.

A display apparatus including a distance separator according to one or more embodiments of the invention is described below in more detail with reference to the accompanying drawings. Those components that are the same or are in correspondence are generally rendered the same reference numeral regardless of the figure number, and redundant explanations are omitted.

Figure 2:
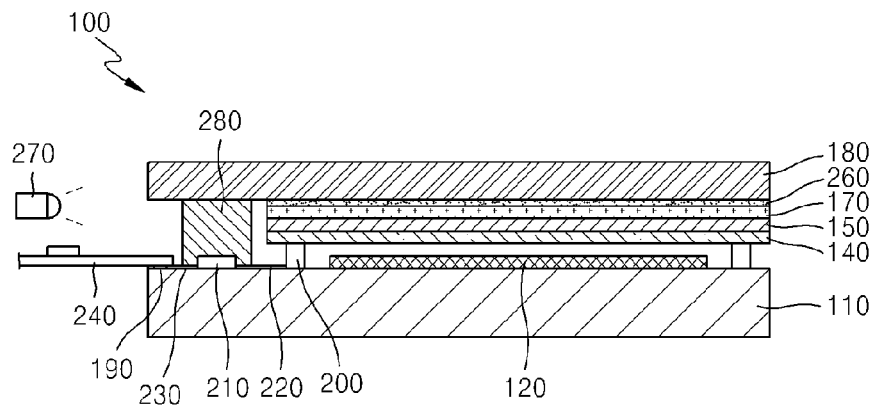
FIG. 2 is a cross-sectional view of irradiating ultraviolet rays on the display apparatus of FIG. 1.

FIG. 1 is a perspective view of a display apparatus 100 according to an embodiment of the present invention, and FIG. 2 is a cross-sectional view of irradiating ultraviolet (UV) rays on the display apparatus 100 of FIG. 1.

In one embodiment, the display apparatus 100 is an organic light-emitting display apparatus, but is not limited thereto as long as an image is realized as predetermined power is supplied.

Referring to FIGS. 1 and 2, the display apparatus 100 includes a display panel 160 including a substrate 110, a display unit 120 formed on the substrate 110 and realizing an image, and an encapsulation unit 140 for covering the display unit 120.

The substrate 110 includes rigid glass. The encapsulation unit 140 may be glass, a substrate formed of a polymer resin, or a flexible film. Alternatively, the encapsulation unit 140 may be formed by alternately stacking an organic film and an inorganic film.

Figure 3:
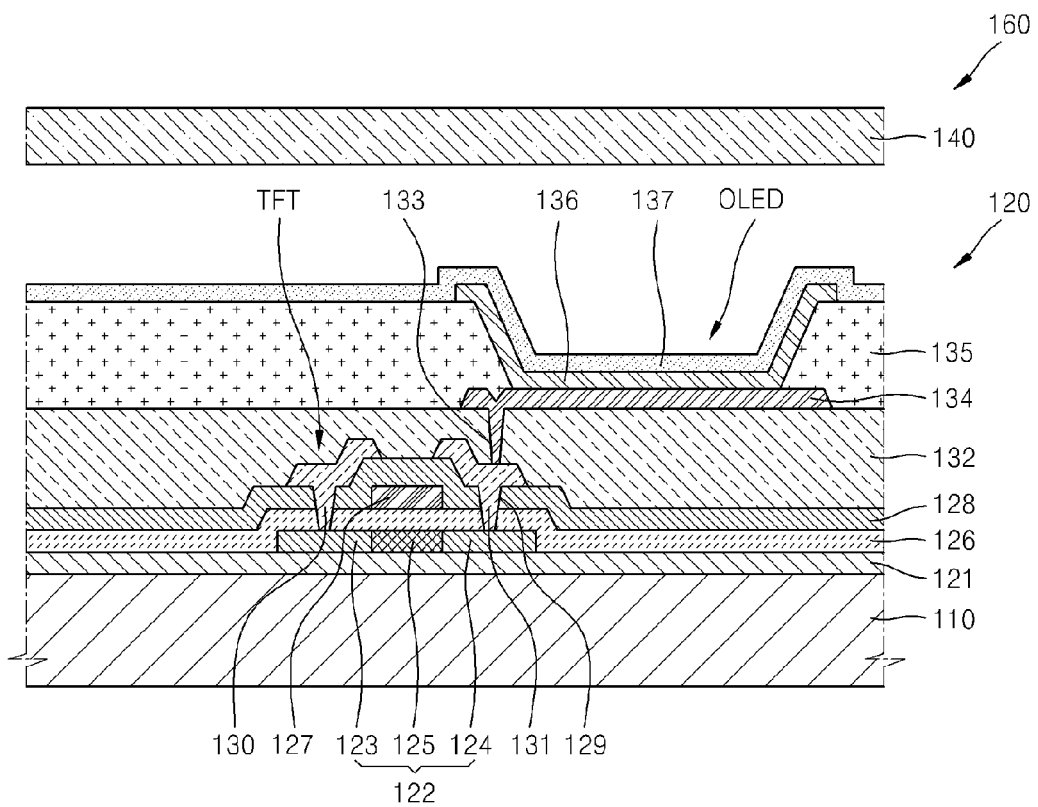
FIG. 3 is a cross-sectional view of one sub-pixel of the display apparatus of FIG. 1.

The display unit 120 is formed on the substrate 110 based on a sub-pixel of the display apparatus 100 shown in FIG. 3.

A barrier layer 121 is formed on the substrate 110. The barrier layer 121 may include an organic film or an inorganic film, or may have a structure in which an organic film and an inorganic film are alternately stacked on each other. The barrier layer 121 blocks oxygen or moisture from penetrating into an organic light-emitting device (OLED).

A thin-film transistor (TFT) is formed on the barrier layer 121. In one embodiment, the TFT is a top gate type, but alternatively, a TFT of another type, such as a bottom gate type, may also be used.

A semiconductor active layer 122 is formed on the barrier layer 121. The semiconductor active layer 122 may include polycrystalline silicon, but a material of the semiconductor active layer 122 is not limited thereto, and may be an oxide semiconductor.

Examples of the oxide semiconductor include oxides of metal elements of Groups 12, 13, and 14, such as, for example, zinc (Zn), indium (In), gallium (Ga), tin (Sn), cadmium (Cd), germanium (Ge), and hafnium (Hf), and a combination thereof.

The semiconductor active layer 122 has a source region 123 and a drain region 124 by doping N-type impurity ions and P-type impurity ions. A channel region 125 where an impurity is not doped is formed between the source and drain regions 123 and 124.

A gate insulating film 126 is deposited on the semiconductor active layer 122. The gate insulating film 126 includes an inorganic film formed of a silicon oxide, a silicon nitride, or a metal oxide, and may have a structure of a single layer or multiple layers of the inorganic film.

A gate electrode 127 is formed on the gate insulating film 126. The gate electrode 127 may include a single layer or multiple layers of, for example, gold (Au), silver (Ag), copper (Cu), nickel (Ni), platinum (Pt), palladium (Pd), aluminum (Al), molybdenum (Mo), or chromium (Cr), or may include an alloy, such as, for example, Al:neodymium (Nd) or Mo:tungsten (W).

An interlayer insulating film 128 is formed on the gate electrode 127. The interlayer insulating film 128 may be an inorganic film including a silicon oxide or silicon nitride. The interlayer insulating film 128 may also include an organic film.

A source electrode 130 and a drain electrode 131 are formed on the interlayer insulating film 128. A contact hole 129 is formed by selectively removing the gate insulating film 126 and the interlayer insulating film 128. Through the contact hole 129, the source electrode 130 is electrically connected to the source region 123, and the drain electrode 131 is electrically connected to the drain region 124.

A protection film (passivation film and/or planarization film) 132 is formed on the source and drain electrodes 130 and 131. The protection film 132 protects and planarizes the TFT therebelow. The protection film 132 may have any one of various shapes, and may include an organic material, such as, for example, benzocyclobutene (BCB) or acryl, or an inorganic material, such as silicon nitride (SiNx). The protection film 132 may be in a single layer or a multilayer.

The OLED is formed on the TFT.

In order to form the OLED, a first electrode 134 corresponding to a pixel electrode is electrically connected to any one of the source and drain electrodes 130 and 131 through a contact hole 133.

The first electrode 134 functions as an anode from among electrodes included in the OLED, and may include any one of various conductive materials. The first electrode 134 may be a transparent electrode or a reflective electrode according to purposes.

For example, the first electrode 134 may include indium tin oxide (ITO), indium zinc oxide (IZO), zinc oxide (ZnO), or indium oxide ($In_2O_3$) when used as a transparent electrode. When the first electrode 134 is used as a reflective electrode, the first electrode 134 may include forming a reflective film formed of Ag, Mg, Al, Pt, Pd, Au, Ni, Nd, Ir, Cr, or a compound thereof and then depositing ITO, IZO, ZnO, or $In_2O_3$ on the reflective film.

A pixel-defining layer (PDL) 135 is formed on the protection film 132 to cover an edge of the first electrode 134 of the OLED. The PDL 135 defines an emission region of each sub-pixel by surrounding the edge of the first electrode 134.

The PDL 135 includes an organic material or an inorganic material.

Accordingly, the PDL 135 may include an organic material, such as, for example, polyimide, polyamide, BCB, acryl resin, or phenol resin, or an inorganic material, such as, for example, SiNx. A structure of the PDL 135 may vary and may be, for example, a single film or multiple films.

An intermediate layer 136 is formed in an exposed portion on the first electrode 134 by etching a part of the PDL 135. The intermediate layer 136 may be formed via a deposition process.

In one embodiment, the intermediate layer 136 is patterned to correspond only to each sub-pixel, or the first electrode 134 that is patterned, but FIG. 3 is illustrated for convenience of describing a structure of the sub-pixel, and thus an embodiment of the present invention is not limited thereto.

The intermediate layer 136 may include a low molecular organic material or a high molecular organic material.

Figure 4:
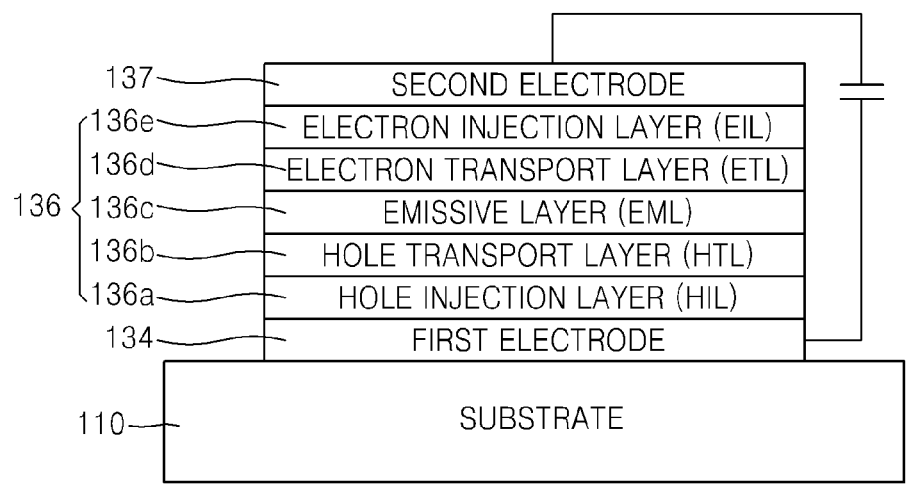
FIG. 4 is a structural diagram of an organic light-emitting device (OLED) of FIG. 3.

For example, as shown in FIG. 4, the intermediate layer 136 includes an emissive layer (EML) 136c, and may further include at least one of a hole injection layer (HIL) 136a, a hole transport layer (HTL) 136b, an electron transport layer (ETL) 136d, and an electron injection layer (EIL) 136e. Alternatively, the intermediate layer 136 may include the EML 136c and other various functional layers.

Referring back to FIG. 3, a second electrode 137 corresponding to a common electrode of the OLED is formed on the intermediate layer 136. Like the first electrode 134, the second electrode 137 may be a transparent electrode or a reflective electrode.

The first and second electrodes 134 and 137 are insulated from each other by the intermediate layer 136. When a voltage is applied to the first and second electrodes 134 and 137, a visible light is emitted from the intermediate layer 136, and thus an image recognizable by a user is realized.

When the second electrode 137 is used as a transparent electrode, the second electrode 137 may be formed by depositing a metal having a low work function, such as, for example, Li, Ca, LiF/Ca, LiF/Al, Al, Mg, or a compound thereof, on the intermediate layer 136, and then forming an auxiliary electrode formed of a material for forming a transparent electrode, such as, for example, ITO, IZO, ZnO, or $In_2O_3$.

When the second electrode 137 is used as a reflective electrode, the second electrode 137 is formed by depositing, for example, Li, Ca, LiF/Ca, LiF/Al, Al, Mg, or a compound thereof throughout a display region.

When the first electrode 134 is used as a transparent or reflective electrode, the first electrode 134 may have a shape corresponding to an opening of each sub-pixel. The second electrode 137 may be formed by depositing a transparent or reflective electrode throughout a display region. Alternatively, the second electrode 137 may be patterned in any one of various patterns. Also, locations of the first and second electrodes 134 and 137 may be switched.

The encapsulation unit 140 is combined with the OLED on the OLED. The encapsulation unit 140 is formed to protect the OLED or other thin films from external moisture or oxygen.

The encapsulation unit 140 may be rigid glass, a polymer resin, or a flexible film. Alternatively, the encapsulation unit 140 may be formed by alternately stacking an organic film and an inorganic film on the OLED. The numbers of the organic and inorganic films may be at least two.

Referring back to FIGS. 1 and 2, a cell seal 200 for encapsulating a region where the display unit 120 is formed is provided on facing surfaces of the substrate 110 and the encapsulation unit 140. The cell seal 200 is formed along edges of the substrate 110 and encapsulation unit 140. Alternatively, the encapsulation unit 140 may be stacked on the substrate 110 without the cell seal 200.

A touch screen 150 is formed on the encapsulation unit 140. The touch screen 150 may be an on-cell touch screen panel (TSP) where a touch screen pattern is formed on the encapsulation unit 140. The touch screen 150 may be integrally formed on the encapsulation unit 140, but is not limited thereto.

A polarizing plate 170 is formed on the touch screen 150. The polarizing plate 170 prevents an external light from reflecting from the display unit 120.

A window cover 180 for protecting the display apparatus 100 is provided on the polarizing plate 170. The window cover 180 generally includes rigid glass.

The substrate 110 of the display panel 160 includes an exposed region A that extends towards an edge of the encapsulation unit 140. The exposed region A may be formed by enlarging any one region of the substrate 110 such that a size of the substrate 110 is larger than a size of the encapsulation unit 140.

A display driver integrated circuit (DDI) 210 is provided on the exposed region A. The DDI 210 is electrically connected to components shown in FIG. 3 of the display unit 120 through a first wiring 220.

The DDI 210 is connected to a plurality of pad units 190 through a second wiring 230. The plurality of pad units 190 are arranged along an edge of the substrate 110.

A terminal 250 of a circuit board 240 is electrically connected to the pad unit 190 to receive an external signal. The circuit board 240 may be, for example, a flexible printed circuit board (FPCB).

As such, not only are the plurality of pad units 190 arranged on the exposed region A, but also the DDI 210, the first wiring 220, and the second wiring 230.

A gap exists between the exposed region A and the window cover 180. Due to the gap, the exposed region A may be easily damaged when the display apparatus 100 is dropped. Thus, a distance separator 280 for maintaining the gap is provided between the exposed region A and the window cover 180.

An adhesive 260 is interposed in at least one of regions where the display panel 160, the touch screen 150 and the polarizing plate 170 that are functional films adhered on the display panel 160, and the window cover 180 adhered on the functional films are adhered to each other.

In one embodiment, the adhesive 260 is interposed only between the polarizing plate 170 and the window cover 180, but it will be obvious to one of ordinary skill in the art that an adhesive material for adhering a plurality of components forming the display apparatus 100 is interposed between the components.

The display apparatus 100 having the above structure is manufactured by adhering the touch screen 150, the polarizing plate 170, and the window cover 180 on the display panel 160, and then irradiating UV rays by using an apparatus 270 for irradiating UV rays to harden the adhesive 260 therebetween.

However, when UV rays are irradiated towards the adhesive 260 from the apparatus 270 while being spaced apart from the display apparatus 100, the distance separator 280 provided between the exposed region A and the window cover 180 inevitably blocks UV rays, and thus the adhesive 260 may not be smoothly hardened.

Accordingly, the distance separator 280 includes at least one opening providing a path for UV rays between the display panel 160 and the window cover 180.

Figure 5:
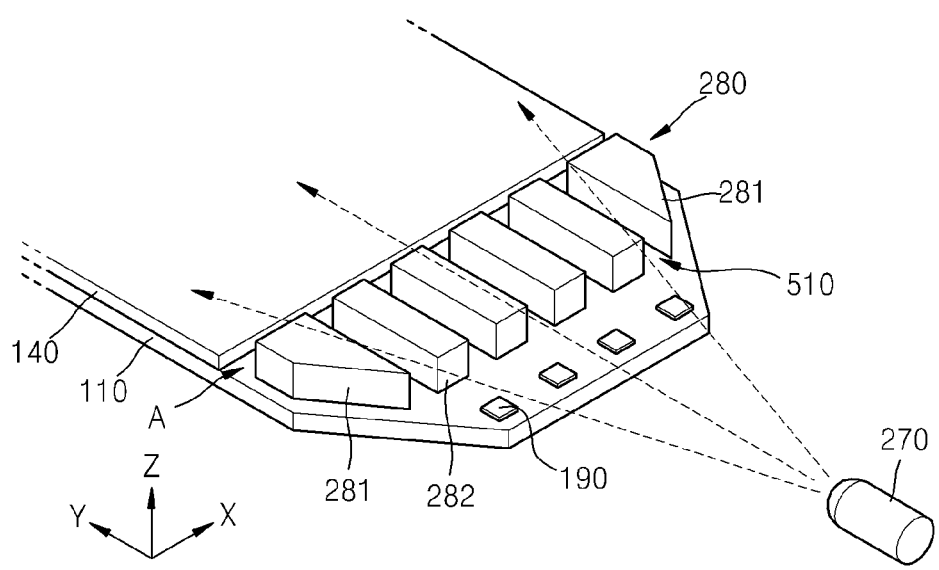
FIG. 5 is an enlarged perspective view of a region where a distance separator of FIG. 2 is provided, according to an embodiment of the present invention.

FIG. 5 is an enlarged perspective view of a region where the distance separator 280 of FIG. 2 is provided, according to an embodiment of the present invention.

Figure 6:
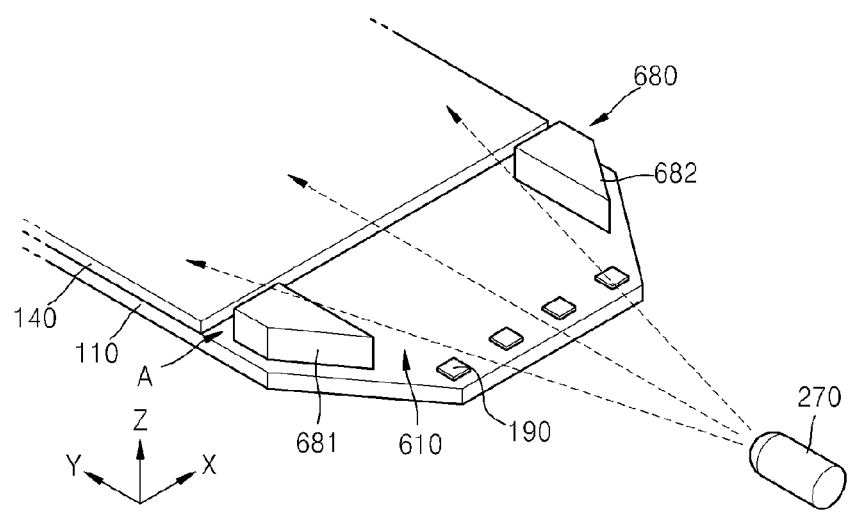
FIG. 6 is an enlarged perspective view of a region where a distance separator is provided, according to another embodiment of the present invention.
Figure 7:
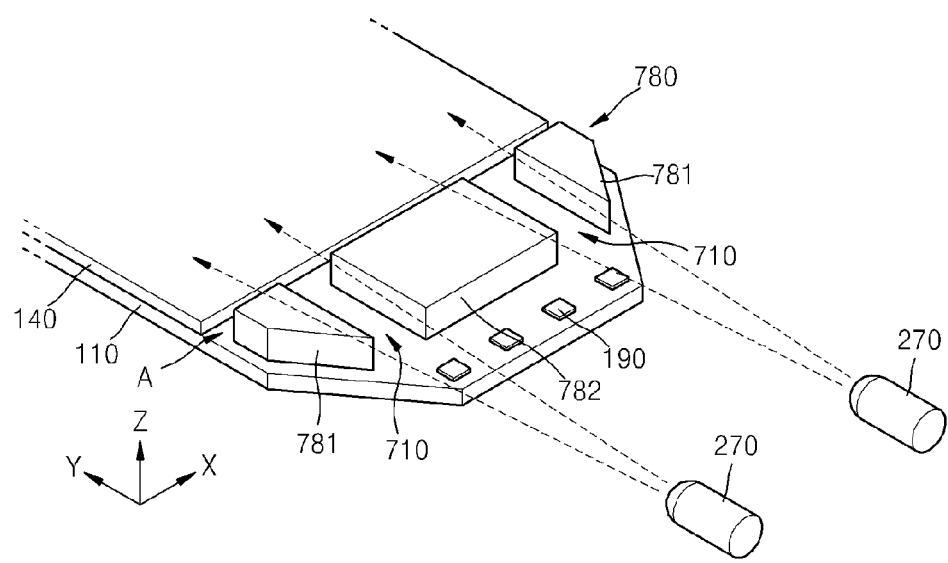
FIG. 7 is an enlarged perspective view of a region where a distance separator is provided, according to another embodiment of the present invention.

In FIGS. 5, 6, and 7, the pad unit 190, the DDI 210, the first wiring 220, and the second wiring 230 described above with reference to FIG. 2 are arranged in the exposed region A, but descriptions thereof are omitted for convenience of description. Also, the functional films and the window cover 180 disposed on the substrate 110 are omitted from description.

Referring to FIG. 5, the encapsulation unit 140 is formed on the substrate 110. The substrate 110 includes the exposed region A as the substrate 110 extends towards on edge of the encapsulation unit 140. The plurality of pad units 190 are arranged at an edge of the exposed region A. The pad units 190 are spaced apart from each other along an X-direction of the substrate 110.

The distance separator 280 for maintaining the gap between the display panel 160 and the window cover 180 is provided on the exposed region A.

The distance separator 280 includes pluralities of first and second spacers 281 and 282 spaced apart from each other along the X-direction of the exposed region A. The plurality of first spacers 281 are arranged at two edges of the exposed region A in the X-direction, and the plurality of second spacers 282 are disposed between the plurality of first spacers 281 and spaced apart from each other.

The first and second spacers 281 and 282 are spaced apart from each other in a direction parallel to a direction (the X-direction) in which the pad units 190 are arranged. The first and second spacers 281 and 282 are arranged in a direction crossing a direction (a Y-direction) in which the first and second wirings 220 and 230 are electrically connected to electrically connect the pad units 190 and devices of the display unit 120 of FIG. 1.

The first and second spacers 281 and 282 may have any shape, such as, for example, a square pillar shape, as long as the first and second spacers 281 and 282 have a size corresponding to the gap between the exposed region A and the window cover 180 of FIG. 2.

The first and second spacers 281 and 282 may be formed not only on the pad units 190 on the exposed region A, but also on the DDI 210, the first wiring 220, and the second wiring 230.

The first and second spacers 281 and 282 are each disposed on at least any one of regions where the pad unit 190, the DDI 210, the first wiring 220, and the second wiring 230 are formed on the exposed region A. An insulating film may be formed to cover the pad unit 190, the DDI 210, the first wiring 220, and the second wiring 230.

The first and second spacers 281 and 282 may include an insulating material, such as, for example, a polymer material such as polyethylene terephthalate (PET), to prevent an electric short circuit. Alternatively, the first and second spacers 281 and 282 may include a foam material to easily absorb a shock.

A plurality of openings 510 for providing paths of UV rays irradiated from the apparatus 270 towards the adhesive 260 between the components of the display apparatus 100 are formed between the first and second spacers 281 and 282.

When UV rays are irradiated from the apparatus 270 at one side of the display apparatus 100 towards the adhesive 260, UV rays are irradiated on the adhesive 260 through the openings 510. Thus, the adhesive 260 is smoothly hardened.

As such, by disposing the distance separator 280 having the first and second spacers 281 and 282 between the display panel 160 and the window cover 180, the display apparatus 100 maintains structural stability. Moreover, by irradiating UV rays on the adhesive 260 through the openings 510 formed between the first and second spacers 281 and 282, adhesive strength between the components adhered on the display panel 160 is increased.

FIG. 6 is an enlarged perspective view of a region where a distance separator 680 is provided, according to another embodiment of the present invention.

Referring to FIG. 6, the substrate 110 includes the exposed region A by extending towards one edge of the encapsulation unit 140. The plurality of pad units 190 are arranged on an edge of the exposed region A. The pad units 190 are spaced apart from each other along the X-direction of the substrate 110.

The distance separator 680 for maintaining the gap between the substrate 110 and the window cover 180 is provided on the exposed region A, or on a region where only one of the substrate 110 and the encapsulation unit 140 forming the display panel 160 exists. The distance separator 680 has a size corresponding to the gap between the exposed region A and the window cover 180 of FIG. 2.

The distance separator 680 includes first and second spacers 681 and 682 disposed along the X-direction of the exposed region A. The first and second spacers 681 and 682 are disposed at two edges of the exposed region A in the X-direction. The first and second spacers 681 and 682 include an insulating material.

An opening 610 for providing a path of UV rays irradiated from the apparatus 270 is formed between the first and second spacers 681 and 682.

Unlike the openings 510 of FIG. 5, the opening 610 in FIG. 6 is formed in a single space, and thus, a space for UV rays irradiated from the apparatus 270 to pass through is larger. As such, since there is a higher amount of UV rays, the adhesive 260 may be further strongly hardened.

FIG. 7 is an enlarged perspective view of a region where a distance separator 780 is provided, according to another embodiment of the present invention.

Referring to FIG. 7, a portion of the substrate 110 extends towards the encapsulation unit 140, and thus the substrate 110 has the exposed region A. The plurality of pad units 190 are arranged on the edge of the exposed region A. The pad units 190 are spaced apart from each other along the X-direction of the substrate 110.

The distance separator 780 for maintaining the gap between the exposed region A and the window cover 180 disposed as an uppermost layer from among the components stacked on the display panel 160 is provided on the exposed region A. The distance separator 780 has a size corresponding to the gap between the exposed region A and the window cover 180.

The distance separator 780 includes a plurality of first spacers 781 and a second spacer 782 disposed along the X-direction of the exposed region A. The first spacers 781 are disposed at two edges of the exposed region A along the X-direction, and the second spacer 782 is disposed between the first spacers 781. The first and second spacers 781 and 782 include an insulating material.

A plurality of openings 710 for providing paths of UV rays irradiated from the apparatus 270 are formed between the first spacers 781 and the second spacer 782.

In one embodiment, since UV rays are simultaneously irradiated through the openings 710 as a plurality of the apparatus 270 are provided at one side of the display apparatus 100, a hardening process using UV rays may be further efficiently performed.

As described above, according to one or more embodiments of the present invention, a display apparatus including a distance separator has structural stability by providing the distance separator having at least one opening. Also, an adhesive interposed between each component of the display apparatus is easily hardened.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A display apparatus comprising:
   a display panel comprising:
      a substrate where a display unit is formed, and
      an encapsulation unit covering the display unit;
   a functional film adhered to the display panel;
   a window cover provided on the functional film; and
   an adhesive interposed in at least one of regions where the display panel, the functional film, and the window cover are adhered to each other,
   wherein a distance separator, comprising at least one opening for providing a path for ultraviolet rays for hardening the adhesive, is provided between the display panel and the window cover.

2. The display apparatus of claim 1, wherein the substrate comprises an exposed region that extends towards an edge of the encapsulation unit, and
   wherein the distance separator is provided between the exposed region of the substrate and the window cover.

3. The display apparatus of claim 2, wherein a plurality of pad units electrically connected to a wiring are arranged in the exposed region of the substrate, and
   wherein the distance separator comprises a plurality of spacers provided on and insulated from the wiring or at least one of the regions where the plurality of pad units are formed.

4. The display apparatus of claim 3, wherein the plurality of spacers are spaced apart from each other in a direction crossing a direction where the wiring and the plurality of pad units are electrically connected to each other.

5. The display apparatus of claim 3, wherein the plurality of spacers are spaced apart from each other in a direction parallel to a direction in which the plurality of pad units are arranged.

6. The display apparatus of claim 2, wherein the distance separator comprises a plurality of spacers spaced apart from each other along one direction of the exposed region of the substrate, and
   the at least one opening is formed between the plurality of spacers.

7. The display apparatus of claim 6, wherein the plurality of spacers comprise a plurality of first spacers arranged at two edges of the exposed region of the substrate, and at least one second spacer disposed between the plurality of first spacers.

8. The display apparatus of claim 2, wherein the distance separator comprises a plurality of spacers disposed along the exposed region of the substrate, and
   the at least one opening forms a single space between the plurality of spacers.

9. The display apparatus of claim 8, wherein the plurality of spacers are arranged at two edges of the exposed region of the substrate, and the at least one opening is formed between the plurality of spacers.

10. The display apparatus of claim 2, wherein the distance separator has a size corresponding to a gap between the exposed region of the substrate and the window cover.

11. The display apparatus of claim 2, wherein the distance separator is provided between the window cover and a region where only one of the substrate and the encapsulation unit exists as one of the substrate and the encapsulation unit extends further than the other.

12. The display apparatus of claim 2, wherein the exposed region of the substrate is formed by enlarging any one region of the substrate such that a size of the substrate is larger than a size of the encapsulation unit.

13. The display apparatus of claim 1, wherein the distance separator comprises an insulating material.

14. The display apparatus of claim 1, wherein the display unit comprises:
   a thin-film transistor (TFT); and
   an organic light-emitting device electrically connected to the TFT and comprising a first electrode, a second electrode, and an intermediate layer comprising an emissive layer disposed between the first and second electrodes.

15. The display apparatus of claim 1, wherein the functional film comprises a polarizing plate.

16. The display apparatus of claim 1, wherein the functional film comprises a touch screen.

17. The display apparatus of claim 16, wherein the touch screen is an on-cell touch screen panel integrally formed with an outer surface of the encapsulation unit.

18. The display apparatus of claim 1, wherein the substrate is rigid.

19. The display apparatus of claim 1, wherein the encapsulation unit is a rigid substrate or a flexible substrate.

20. The display apparatus of claim 1, wherein the window cover is a rigid substrate.

* * * * *